(12) United States Patent
Suzuki et al.

(10) Patent No.: US 7,750,437 B2
(45) Date of Patent: Jul. 6, 2010

(54) SEMICONDUCTOR DEVICE HAVING A DIODE FOR A RECTIFIER CIRCUIT

(75) Inventors: Hideaki Suzuki, Kawasaki (JP);
Hidetoshi Sugiyama, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1083 days.

(21) Appl. No.: 11/229,161

(22) Filed: Sep. 19, 2005

(65) Prior Publication Data
US 2006/0273403 A1 Dec. 7, 2006

(30) Foreign Application Priority Data
Jun. 2, 2005 (JP) ............................. 2005-162094

(51) Int. Cl.
*H01L 29/93* (2006.01)
(52) U.S. Cl. .................. 257/548; 257/544; 257/121
(58) Field of Classification Search ................ 327/303; 257/548, 544, 121; 363/125, 126
See application file for complete search history.

(56) References Cited

U.S. PATENT DOCUMENTS 5,148,250 A * 9/1992 Winnerl et al. .............. 257/361

FOREIGN PATENT DOCUMENTS

| | | | |
|---|---|---|---|
| DE | 34 00 973 A1 | 7/1985 | |
| EP | 1 067 667 A1 | 1/2001 | |
| EP | 1 489 733 A2 | 12/2004 | |
| JP | 61 218158 A | 9/1986 | |
| JP | 05206485 A | * | 8/1993 |
| JP | 10 200056 A | 7/1998 | |
| JP | 10-201239 | 7/1998 | |

* cited by examiner

*Primary Examiner*—Kenneth A Parker
*Assistant Examiner*—Jose R Diaz
(74) *Attorney, Agent, or Firm*—Fujitsu Patent Center

(57) ABSTRACT

A semiconductor device has a rectifier circuit and integrated circuit on a semiconductor substrate of a first conduction type, and has a first well region in the substrate, a second well region in first well region, and a diode region formed in second well region and constituting a diode with second well region. The rectifier circuit is formed by the diodes. An input power supply terminal, changing between positive and negative potentials, is connected to second and first well regions of a first diode and to diode region of a second diode. A current supply terminal is provided in the vicinity of first well region of first diode, and is connected to the substrate and a prescribed power supply, so as to supply a current to the PN junction between the first well region and the semiconductor substrate when the input power supply terminal is at negative potential.

18 Claims, 11 Drawing Sheets

FIG.1A

RECTIFIER CIRCUIT

FIG.1B

WAVEFORMS OF ANTENNA
AND POWER SUPPLY

SEMICONDUCTOR DEVICE HAVING A DIODE FOR A RECTIFIER CIRCUIT

CROSS-REFERENCE TO RELATED APPLICATIONS

This application is based upon and claims the benefit of priority from the prior Japanese Patent Application No. 2005-162094, filed on Jun. 2, 2005, the entire contents of which are incorporated herein by reference.

BACKGROUND OF THE INVENTION

1. Field of the Invention

The present invention relates to a semiconductor integrated circuit having a diode for an AC-DC rectifier circuit, and in particular relates to a semiconductor device able to prevent currents in the substrate during rectifier circuit operation from generating to become noise sources for other integrated circuits in the substrate.

2. Description of the Related Art

The contact-free IC cards which have been coming into use in recent years do not incorporate a power supply, but receive a supply of electric power by means of electromagnetic radiation from an external source to operate internal circuitry. In such contact-free IC cards, an AC magnetic field at 13.56 MHz is generally supplied from outside, and an internal rectifier circuit rectifies this to obtain a DC power supply, serving as the internal power supply. The internal rectifier circuit normally comprises a bridge circuit with four diodes; in response to the magnetic field supplied to the antenna comprising a coil or other inductance element, the inductance element generates an induced current, and this induced current is supplied to the bridge circuit. Because the induced current is an AC current the polarity of which reverses according to the polarity reversals of the magnetic field, the rectifier circuit, comprising the bridge circuit, is necessary to rectify this AC current to obtain a DC current. A bridge rectifier circuit is described in Japanese Patent Laid-open No. 10-201239.

A diode comprised by a rectifier circuit in turn comprises a pn junction in a p-type well region, formed in a p-type substrate. This p-type well region is further formed within an n-type well region, with the aim of electrically isolating the well region from the p-type substrate. That is, the p-type well region within which the diode is formed has a triple well structure, being formed within an n-type well region formed in a p-type substrate. In order to form CMOS transistors, n-type well regions for p-channel transistors and p-type well regions for n-channel transistors are formed at the surface of a p-type substrate; in addition, another p-type well region is formed within an n-type well region to electrically isolate the p-type well region from the p-type substrate. Transistors and diodes which are not affected by the substrate potential are formed within such p-type well regions isolated from the substrate.

In general, a p-type substrate is connected to ground potential and is at a stable potential. In the case of a triple well structure, the n-type well region is set at a potential higher than ground, or at the same potential as the p-type substrate, so that the pn junction therebetween is not turned on.

SUMMARY OF THE INVENTION

However, if a diode within a p-type well region in such a triple well structure is used in a rectifier circuit, a negative potential may be applied to the n-type well region connected to the antenna terminal, so that the diode between this well region and the p-type substrate is turned on. The current due to formation of this current path is a substrate current, and becomes a source of noise for other integrated circuits on the substrate. According to "ultra LSI memory" written by Seio Itoh, Baifukan, page 260-264, it is reported that when electrons, which are minority carriers, are injected into the p-type substrate, the diffusion length of electrons in the silicon substrate may be 100 μm or longer, affecting transistors and other elements in integrated circuits provided at a distance from the rectifier circuit, and possibly causing malfunctions.

Consequently in a semiconductor device having a rectifier circuit comprising a diode formed within a triple well structure, currents may arise in the p-type substrate during intervals in which the n-type well region is at negative potential, causing fluctuations in the substrate potential, and possibly resulting in malfunctions in other circuits.

Hence an object of this invention is to provide a semiconductor device in which the occurrence of substrate currents due to operation of a rectifier circuit is suppressed.

In order to achieve the above object, according to a first aspect of this invention, in a semiconductor device having a rectifier circuit and integrated circuit on a semiconductor substrate of a first conduction type, the semiconductor device has a first well region of a second conduction type formed in the semiconductor substrate of the first conduction type, a second well region of the first conduction type formed in the first well region, and a diode region of the second conduction type formed in the second well region and, together with the second well region, constituting a diode; and, the rectifier circuit is formed by the plurality of such diodes. An input power supply terminal, which changes between a positive potential and a negative potential, is connected to the second well region and first well region of a first such diode and to the diode region of a second such diode, and a current supply terminal is provided in the vicinity of the first well region of the first diode, and on the side opposite to the region in which is formed the integrated circuit, the current supply terminal being connected to the semiconductor substrate and being connected to a prescribed power supply, so as to supply a current to the PN junction between the first well region and the semiconductor substrate when the input power supply terminal is at negative potential.

According to the above first aspect, when the power supply terminal connected to the rectifier circuit is at negative potential, current is supplied from the current supply terminal to the pn junction between the first well region and the semiconductor substrate, so that the occurrence of current noise in the semiconductor substrate in the region in which the integrated circuit is formed can be suppressed.

In a more preferred form of the above first aspect, the current supply terminal has a first current supply terminal region, which is the periphery of the first well region of the first diode and is positioned a first distance from the first well region on the side opposite to the region in which the integrated circuit is formed, and a second current supply terminal region, which is positioned a second distance, longer than the first distance, from the first well region on the side of the region in which the integrated circuit is formed.

By means of these preferred aspects, current flowing from the current supply terminal flows mainly on the side opposite to the region of formation of the integrated circuit, so that current noise in the semiconductor substrate in the region of formation of the integrated circuit is suppressed.

In a more preferred form of the above first aspect, the current supply terminal is placed so as to surround the periphery of the first well region of the first diode. Further, provided is a trap terminal between the first well region of the first diode and the integrated circuit region, and between the current supply terminal provided on the side of the integrated circuit region and the integrated circuit region, connected to the semiconductor substrate, and connected to a prescribed power supply. The trap terminal, connected to the semiconductor substrate and connected to the prescribed power supply, is also provided so as to surround the periphery of the current supply terminal.

In the above preferred aspect, a protective diode, connected to the input power supply terminal, is positioned between the first well region of the first diode and the second current supply terminal region; or, a protective diode, connected to the input power supply terminal, is positioned between the first well region of the first diode and the current supply terminal region on the side of the integrated circuit region.

In order to achieve the above object, according to a second aspect of this invention, a semiconductor device having a rectifier circuit and integrated circuit on a semiconductor substrate of a first conduction type, comprises:

a first well region of a second conduction type, formed in the semiconductor substrate of the first conduction type;

a second well region of the first conduction type, formed in the first well region; and, a diode region of the second conduction type, formed in the second well region, and which together with the second well region constitutes a diode; wherein the rectifier circuit comprises a pair of first diodes and a pair of second diodes;

a pair of power supply terminals, which change between a positive potential and a negative potential, are respectively connected to the second well regions and the first well regions of the first diodes and to the diode regions of the second diodes; and, a current supply terminal is provided, in the vicinity of the first well regions of the pair of first diodes, connected to the semiconductor substrate and connected to a prescribed power supply, the current supply terminal supplying a current to the pn junctions between the first well regions and the semiconductor substrate when the input power supply terminal is at negative potential.

By means of this invention, it can be suppressed that a substrate current flows in the well regions in which diodes constituting the rectifier circuit are formed, so that the occurrence of noise in the region in which the integrated circuit is formed.

DESCRIPTION OF THE PREFERRED EMBODIMENTS

Below, embodiments of the invention are explained referring to the drawings. However, the technical scope of the invention is not limited to the embodiments, but extends to the inventions described in the Claims, and to inventions equivalent thereto.

Figure 1A:
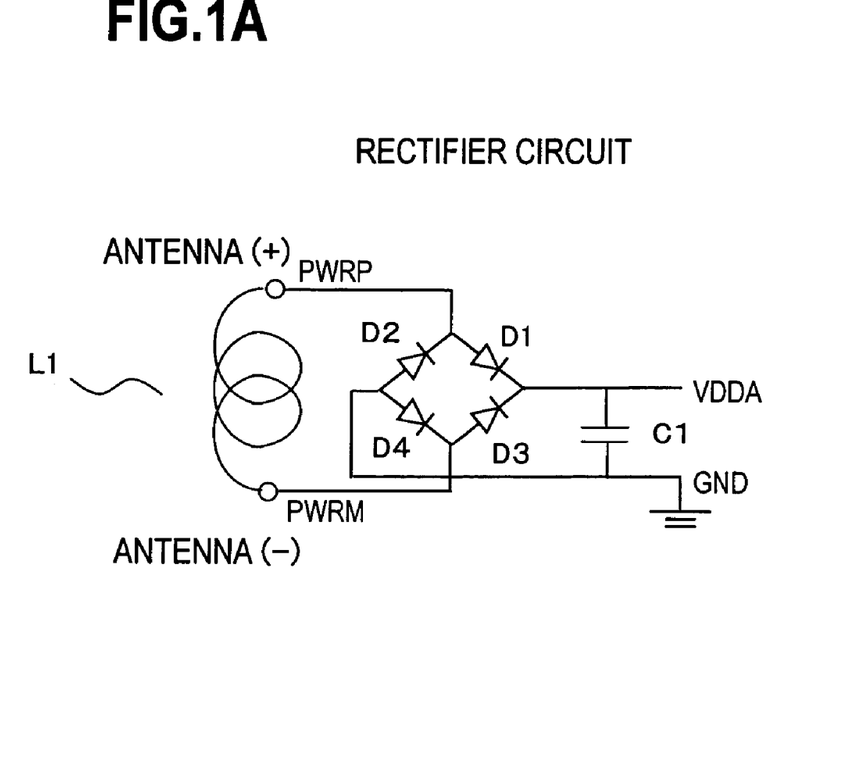
FIG. 1 shows the rectifier circuit and an example of operation waveforms for same in the present embodiment.

FIG. 1 shows the rectifier circuit and an example of operation waveforms for same in the present invention. As shown in the circuit diagram in FIG. 1A, both terminals PWRP, PWRM of the antenna comprising an inductance L1 are input power supply terminals, to which is supplied an alternating induced current arising due to an alternating magnetic field from outside; this pair of input power supply terminals PWRP, PWRM are connected to a rectifier circuit comprised of diodes D1 to D4. An internal power supply terminal VDDA and ground terminal GND are connected to the rectifier circuit, and a smoothing capacitor C1 is connected across these terminals. When the power supply input terminal PWRP is positive and the power supply input terminal PWRM is negative, the diodes D1 and D4 are conducting and the potential of the internal power supply terminal VDDA is caused to rise, and conversely, when the power supply input terminal PWRP is negative and the power supply input terminal PWRM is positive, the diodes D2 and D3 are conducting and the potential of the internal power supply terminal VDDA is caused to rise.

Figure 1B:
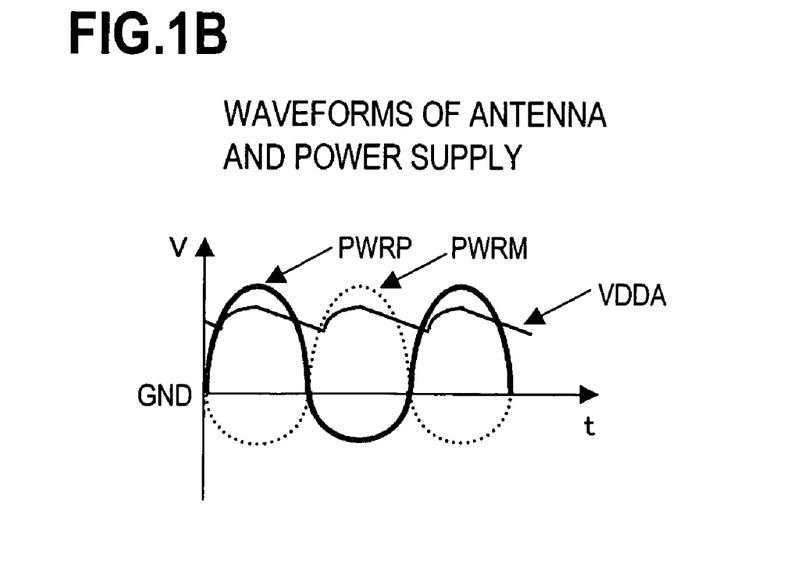

As indicated in the operation waveform diagram of FIG. 1B, the input power supply terminal PWRP alternates between positive and negative, and the input power supply terminal PWRM changes with the opposite polarity. The internal power supply voltage VDDA generated by the rectifier circuit is controlled so as to be a constantly positive voltage, albeit with some rippling.

Though not shown in FIG. 1A, a protective diode circuit, in which a plurality of diodes are connected in series, is provided between the pair of antenna terminals PWRP and PWRM, so that the diodes of the rectifier circuit are not destroyed when a high voltage is applied across the terminals.

Figure 2A:
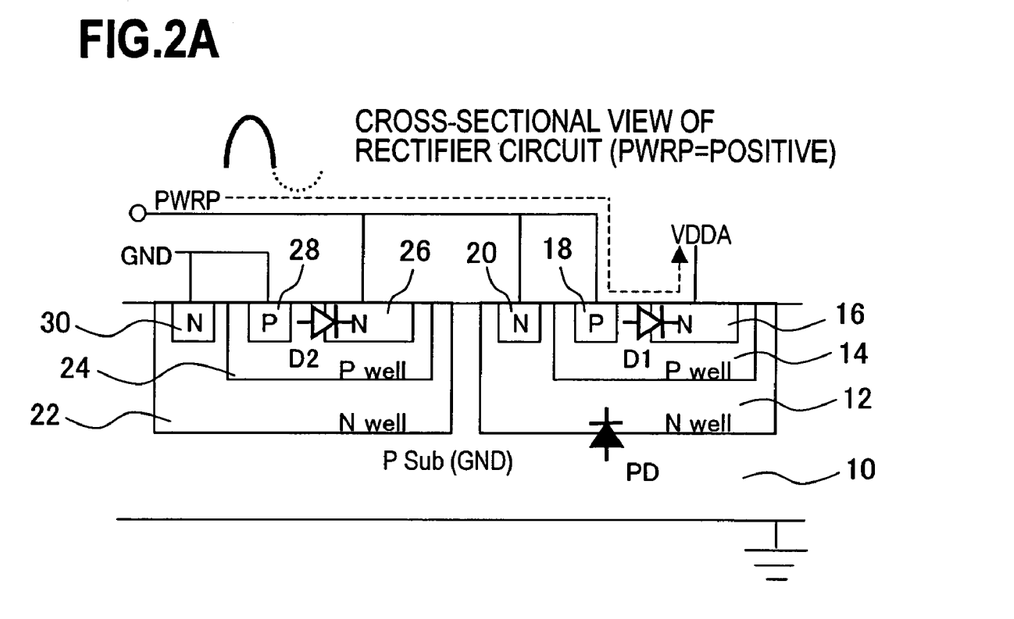
FIG. 2 is a cross-sectional view of a rectifier circuit.
Figure 2B:
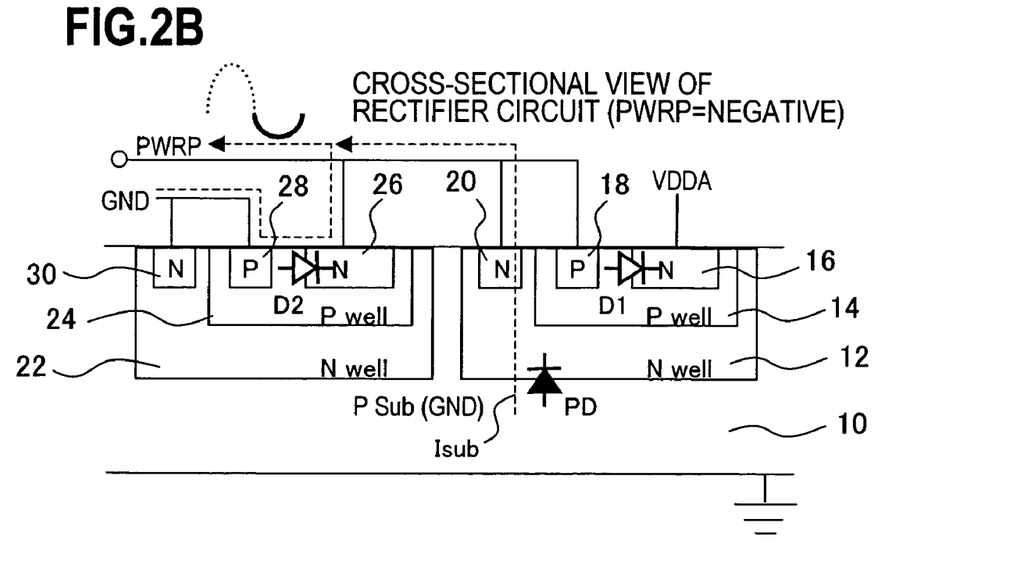

FIG. 2 is a cross-sectional view of the rectifier circuit. The broken line in FIG. 2A indicates the current path when the input power terminal PWRP is positive, and the broken line in FIG. 2B represents the current path when the input power terminal PWRP is negative. The two cross-sectional views show the same structure, and the structures of the diodes D1 and D2 of rectifier circuit are indicted. The diodes D3, D4 have the same structures.

First, the p-type semiconductor substrate 10 is connected to ground GND, and at the surface of the substrate 10 is formed an n-type first well region 12, within which is formed a p-type second well region 14. In the second well region 14 is formed an n-type diode region 16 and p-type contact region 18, so that a diode D1 is formed by the pn junction between the p-type second well region 14 and the n-type diode region 16. An n-type contact region 20 is provided in the first well region 12.

Similarly, at the surface of the substrate 10 is formed an n-type first well region 22, inside which is formed a p-type second well region 24; within the second well region 24 are formed an n-type diode region 26 and a p-type contact region 28, and a diode D2 is formed by the pn junction between the p-type second well region 24 and the n-type diode region 26. An n-type contact region 30 is provided in the first well region 22.

The diode region 16 of diode D1 is connected to internal power supply terminal VDDA, and the n-type first well region 12 and p-type second well region 14 are connected to input power supply terminal PWRP. The diode region 26 of diode D2 is connected to input power supply terminal PWRP, and the n-type first well region 22 and p-type second well region 24 are connected to ground GND.

When, as indicated in FIG. 2A, the input power supply terminal PWRP is positive, the diode D1 is conducting and current flows from the input power supply terminal PWRP to the internal power supply terminal VDDA, as indicated by the broken line; the diode D2 is reverse-biased and remains non-conducting. On the other hand, when as shown in FIG. 2B the input power supply terminal PWRP is negative, the diode D2 becomes conducting and current flows from the ground terminal GND to the input power supply terminal PWRP as indicated by the broken line, whereas diode D1 is reverse-biased and remains nonconducting.

However, the parasitic diode PD comprising the pn junction between the p-type semiconductor substrate 10 and the n-type first well region 12 is conducting when the input power supply terminal PWRP is negative, and a current Isub flows from the substrate 10 to the first well region 12 and the input power supply terminal PWRP. This parasitic diode PD is a junction between the substrate and the first well region, and so the impurity concentration thereof is lower than in the diode D2; hence the forward-direction voltage of the parasitic diode PD is lower than that of the diode D2, and so the parasitic diode PD conducts before the diode D2 begins conducting.

In the rectifier circuit structure, a first well region 12 is formed in order to electrically isolate the p-type second well region 14 in which the diodes D1 and D3 are formed from the substrate 10; the first and second well regions 12 and 14 are held at the same potential in order to prevent forward biasing of the pn junction between the first and second well regions 12 and 14. Antenna terminals PWRP, PWRM at negative potentials are connected to the two well regions 12, 14. Consequently when the antenna terminals are at negative potential, the parasitic diode PD between the first well region 12 and the substrate 10 is forward-biased, and the above-described substrate current Isub appears.

Figure 3:
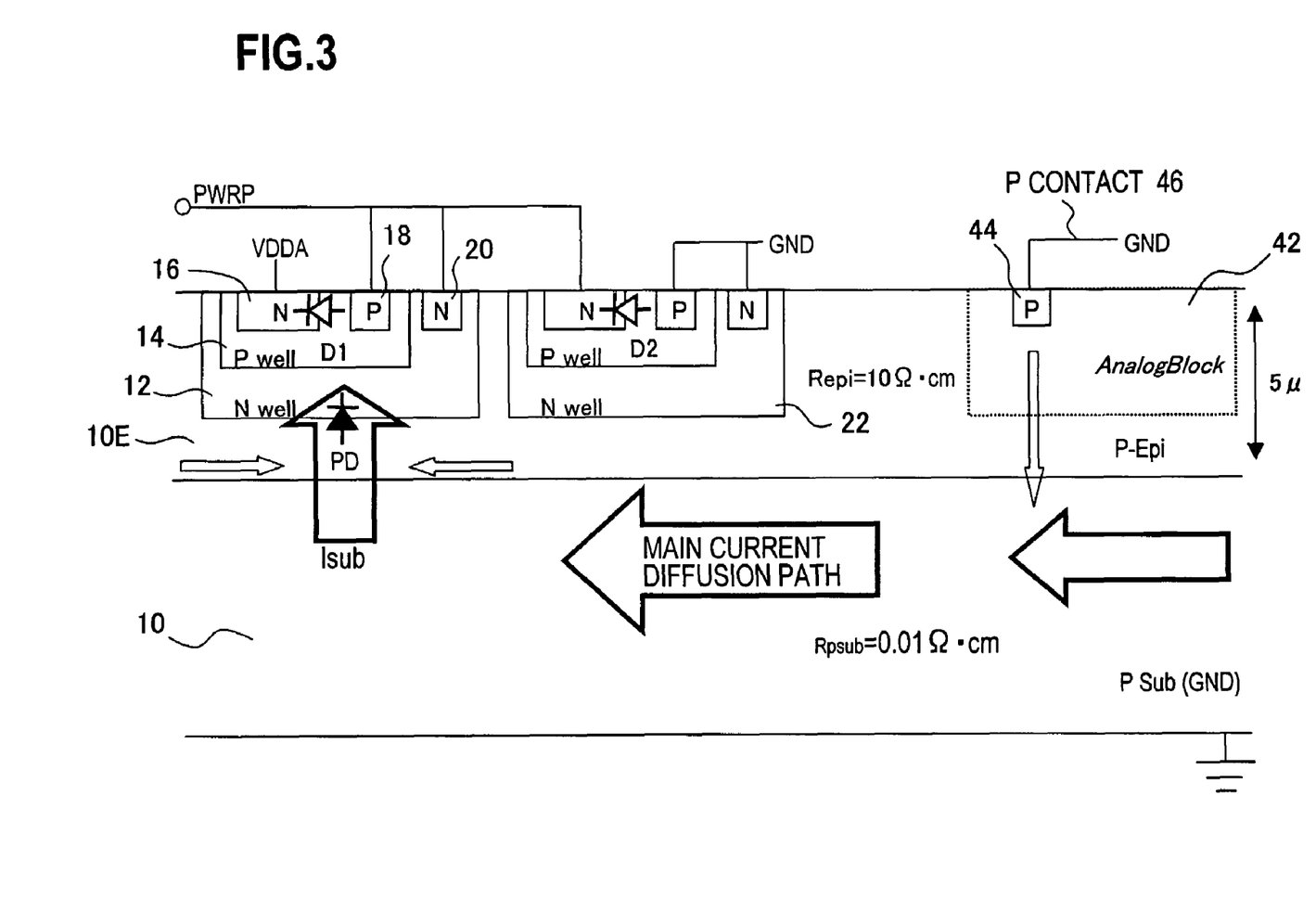
FIG. 3 is a cross-sectional view showing the effect of a substrate current occurring due to the rectifier circuit.

FIG. 3 is a cross-sectional view showing the effect of a substrate current occurring due to the rectifier circuit. In this cross-sectional view, a p-type epitaxial layer 10E is formed on the surface of the p-type semiconductor substrate 10, and in this epitaxial layer 10E are formed the diodes D1 and D2, as well as a p-type well region 42 for the integrated circuit formed in the same semiconductor substrate 10. The diodes D1 and D2 are in positions which are horizontally opposite those in FIG. 2.

When the input power supply terminal PWRP is negative, the parasitic diode PD, comprising the pn junction between the p-type substrate 10 and the epitaxial layer 10E at ground potential and n-type first well region 12, is forward-biased, and begins conducting before the diode D2, so that the substrate current Isub appears. This substrate current Isub is supplied from the contact 46 and contact region 44 which supply the ground potential to the p-type substrate 10; moreover, this substrate current Isub flows primarily within the p-type substrate 10, which has lower resistivity than the epitaxial layer 10E. Because the contact 46 and contact region 44 are formed in the region 42 of the integrated circuit formed in the same substrate, the appearance of the substrate current Isub tends to cause substrate current noise in the integrated circuit, causing malfunctions in the integrated circuit (analog circuits and logic circuits).

Figure 4:
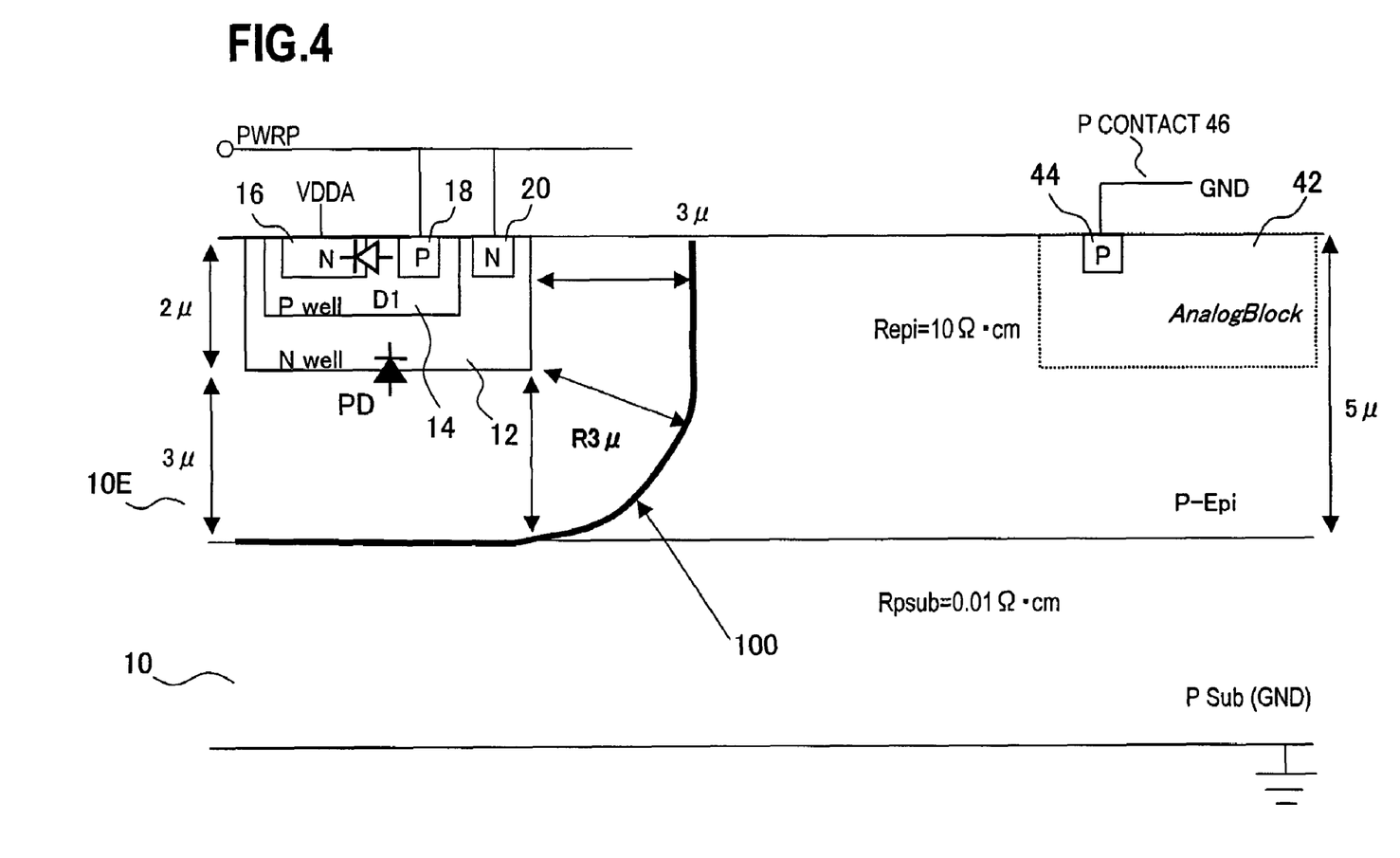
FIG. 4 is a cross-sectional view to explain a substrate current occurring due to the rectifier circuit.

FIG. 4 is a cross-sectional view to explain a substrate current occurring due to the rectifier circuit. This cross-sectional view shows the well structure in which the diode D1 is formed, and the p-type well 42 of the region of the integrated circuit formed in the same substrate. Suppose that the thickness of the p-type epitaxial layer 10E is 5 μm, and that the depth of the n-type first well region 12 is 2 μm. In this case, the current flowing in the pn junction PD between the epitaxial layer 10E and the first well region 12 diffuses uniformly in the p-type epitaxial layer 10E having the same resistivity, spreading as indicated by the symbol 100 in the drawing. When this front 100 reaches the low-resistivity p-type substrate 10, the spreading in the p-type epitaxial layer is sharply reduced, the horizontal-direction current diffusion becomes small, and the current spreads primarily within the low-resistivity p-type substrate 10. Because the resistivity of the p-type substrate 10 is low, when this current diffuses, it becomes a substrate current which reaches to the region of the integrated circuit in the same substrate.

Figure 5:
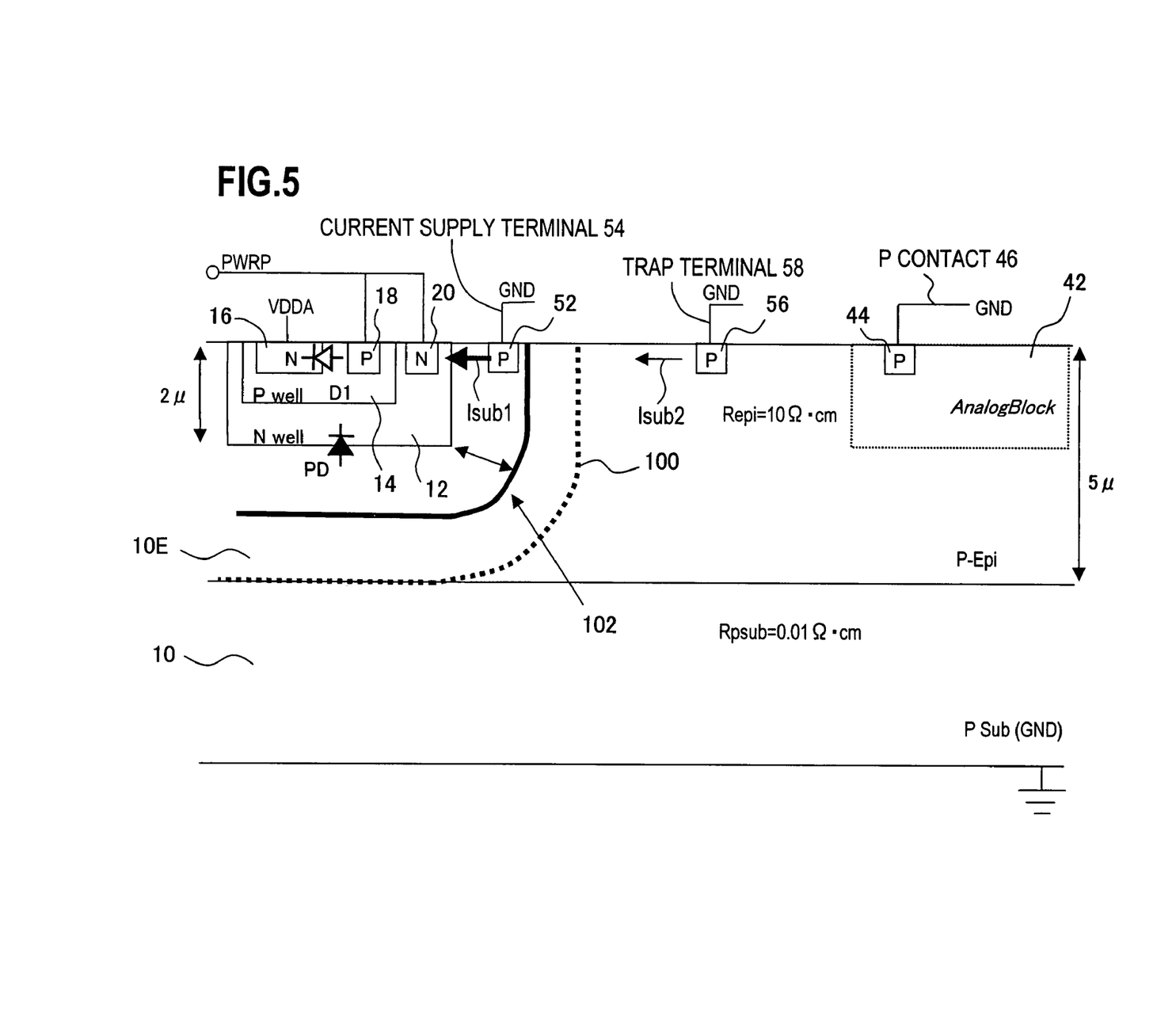
FIG. 5 is a cross-sectional view showing the fundamental configuration of the present embodiment.

FIG. 5 is a cross-sectional view showing the fundamental configuration of the present embodiment. Similarly to FIG. 4, the well structure in which is formed the diode D1 and the p-type well region 42 of the region of the integrated circuit formed in the same substrate are shown. In this embodiment, a current supply terminal 54 and a p-type contact region 52 for same are provided in proximity to the n-type first well region 12 in which the diode D1 is formed. The current Isub1 flowing in the parasitic diode PD when the input power supply terminal PWRP is negative is supplied from this current supply terminal 54 as shown by Isub1. It is desirable that the current supply terminal 54 be provided at a distance from the first well region 12 shorter than the 5 μm thickness of the epitaxial layer 10E. The current supply terminal 54 is connected to the ground power supply GND, having a stable potential. By thus providing the current supply terminal 54 in close proximity to the first well region 12, current diffusion from the pn junction of the parasitic diode PD can be constricted, as indicated by the symbol 102 in the drawing, so that current spreading to the low-resistivity p-type substrate 10 does not occur.

In addition, a trap terminal 58 and p-type contact region 56 are provided between the n-type first well region 12 and the integrated circuit region (p-type well region 42). This trap terminal 58 is also connected to the ground power supply GND. The trap terminal 58 is provided at a greater distance from the first well region 12 than the current supply terminal 54, and moreover is provided between the first well region 12 and the integrated circuit region (p-type well region 42). By this means, even when current supply is insufficient using only the current supply terminal 54, the trap terminal 58 can provide a supplementary current supply (Isub2), so that the flow of substrate current into the integrated circuit region 42 can be suppressed.

Hence a large amount of substrate current Isub1 flows from the current supply terminal 54 in proximity to the first well region 12, and a smaller substrate current Isub2 is expected to flow from the trap terminal 58.

The current supply terminal 54 may also be provided on the side of the first well region 12 opposite the integrated circuit region 42. By providing the current supply terminal 54 on the side opposite the integrated circuit region 42, and by generating a comparatively large substrate current Isub1 at a position away from the integrated circuit region 42, the effect on the integrated circuit region of noise due to substrate current can be suppressed more reliably. Further, the current supply terminal 54 may also be provided at the periphery of the first well region 12. In this case, current flowing through the parasitic diode PD of the first well region 12 is supplied by the current supply terminal 54 surrounded by the periphery, so that the occurrence of noise due to substrate current can be suppressed.

Figure 6:
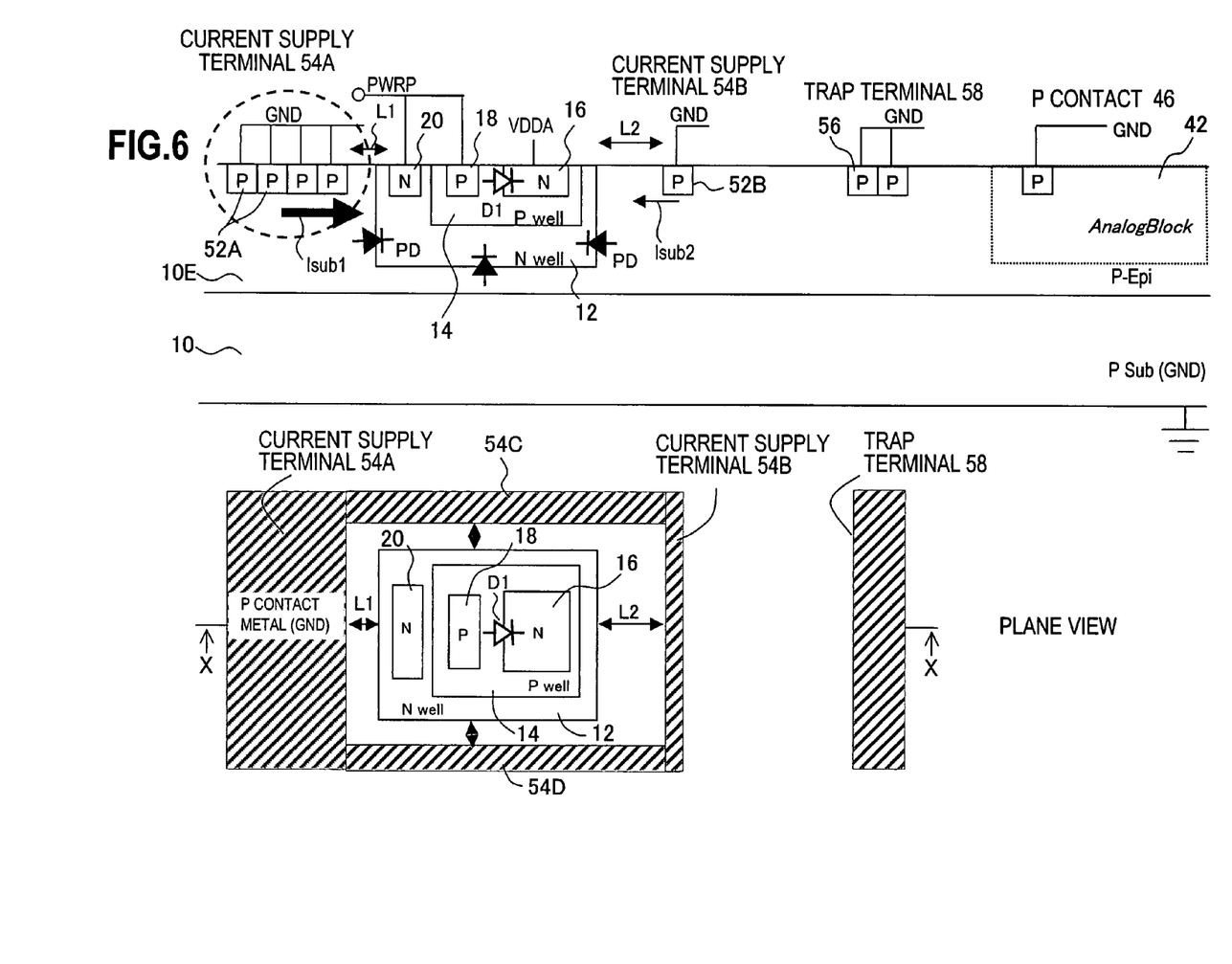
FIG. 6 is a cross-sectional view and plane view of a semiconductor device in a first embodiment.

FIG. 6 is a cross-sectional view and plane view of a semiconductor device in a first embodiment. The cross-sectional view shows the cross-section along X-X in the plane view. In the cross-sectional view, the p-type epitaxial layer 10E is formed on the p-type substrate 10, and the first well regions 12 of the diodes of the rectifying circuit, as well as the p-type well region 42 of the integrated circuit region, are formed in the epitaxial layer 10E. Similarly to the explanation above, in the n-type first well region 12 is formed a p-type second well region 14, within which is formed an n-type diode region 16. The epitaxial layer 10E is the same p-type as the substrate 10, and both can together be regarded as a p-type substrate.

As shown in the cross-sectional view, a current supply terminal 54A and the p-type contact region 52A for same are formed at a distance L1 from the n-type first well region 12. Also, a current supply terminal 54B and the p-type contact region 52B for same are formed at a distance L2 (>L1) from the n-type first well region 12. These current supply terminals 54A, 54B are metal layers connected to the p-type contacts 52A, 52B, and are a metal layer pattern, indicated by the shaded-pattern region in the plane view, which forms current supply terminals. As indicated in the plane view, the current supply terminals 54A, 54B, 54C, 54D are formed so as to surround the periphery of the first well region 12. However, the current supply terminals 54A, 54B are positioned at a short distance L1 apart on the side opposite to the integrated circuit region 42, and are positioned at a longer distance L2 from the integrated circuit region 42 on the same side of the integrated circuit region 42. It is desirable that the shorter distance L1 be, for example, the shortest distance allowed by the design rule. The current supply terminal 54A comprises a metal layer with greater area. By this means, the substrate current flowing into the n-type contact region 20 from the parasitic diode PD when the input power supply terminal PWRP is negative is such that a larger current Isub1 flows from the current supply terminal 54A, and a smaller current Isub2 flows from the side of the current supply terminal 54B. Comparatively large currents also flow from the current supply terminals 54C, 54D, positioned in proximity to and above and below the first well region 12.

By forming a current supply terminal 54A at closer proximity (distance L1), and with larger area, at a position on the side of the first well region 12 opposite to the integrated circuit region 42, the effect on the integrated circuit region 42 of the substrate current Isub1 flowing through the parasitic diode PD can be suppressed.

In this aspect, in addition to the current supply terminals 54A, 54B, 54C, 54D, a trap terminal 58 and a p-type contact region 56 for same are provided between the terminals 54 and the integrated circuit region 42. This trap terminal 58 is also a metal layer connected to a p-type contact region 56. By means of this trap terminal 58, substrate current, which had been insufficient using only the current supply terminals 54, is supplied, and the spreading of substrate current to the integrated circuit region 42 can be suppressed.

Figure 7:
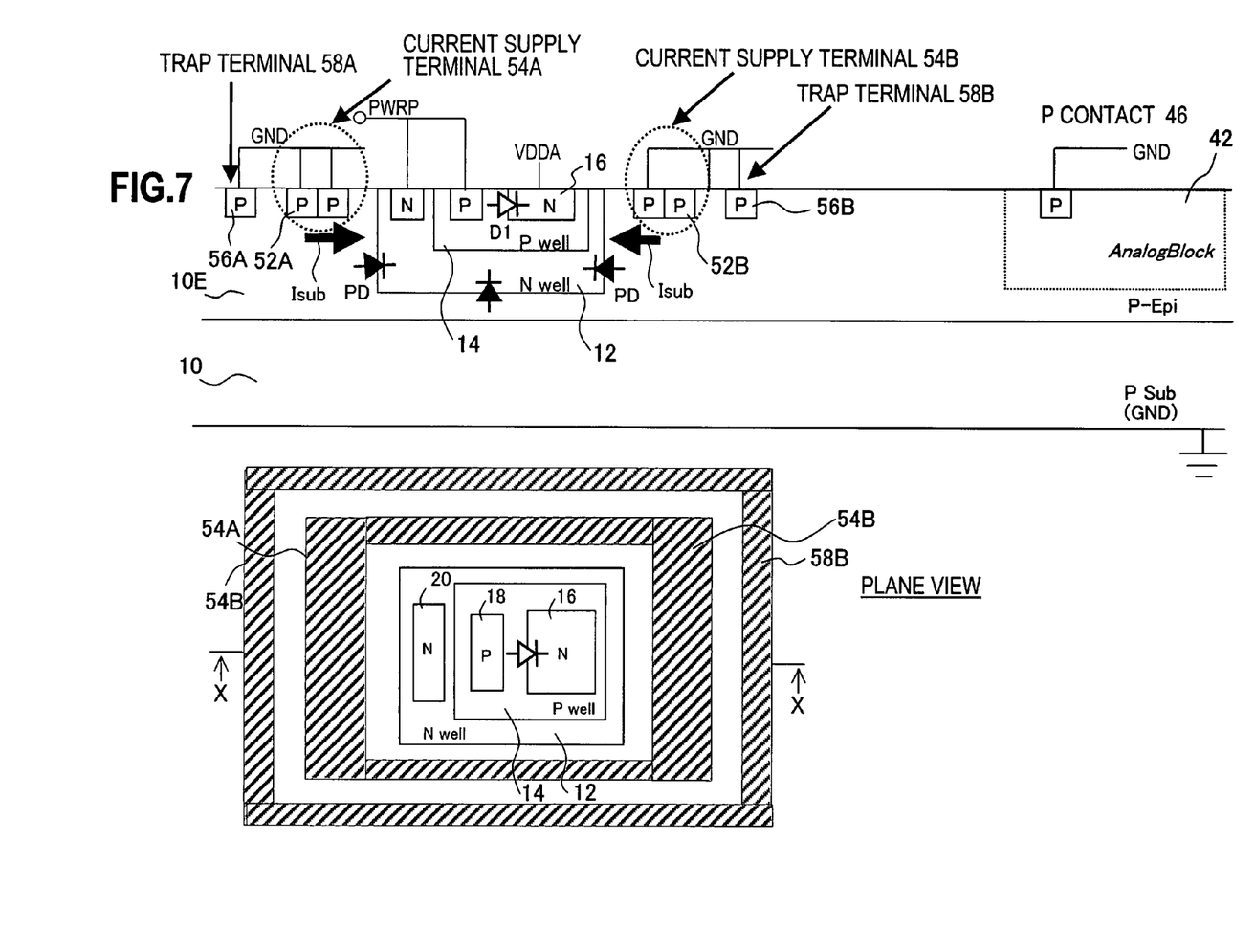
FIG. 7 is a cross-sectional view and plane view of a semiconductor device in a second embodiment.

FIG. 7 is a cross-sectional view and plane view of a semiconductor device in a second embodiment. The cross-sectional view is the cross-section along X-X in the plane view. Each of the regions and terminals shown in the cross-sectional view is the same as in FIG. 6. In this embodiment, differences with the first embodiment shown in FIG. 6 are the formation of current supply terminals 54A and 54B at equal distances on the periphery of the n-type first well region 12, and the formation of trap terminals 58A, 58B on the periphery of the current supply terminals 54A, 54B. These terminals are all connected to the ground power supply GND.

By means of this configuration, substrate current Isub flowing in the parasitic diode PD when the input power supply terminal PWRP is negative flows substantially equally from the current supply terminals 54A and 54B surrounding the first well region 12. Further, when these current supply terminals are inadequate, current also flows substantially equally from the trap terminals 58A and 58B surrounding the current supply terminals. By thus providing dual terminal regions 54, 58 supplying current when the parasitic diode PD is conducting so as to surround the first well region 12, the effect of noise due to substrate current on the integrated circuit region in the same substrate can be alleviated insofar as possible.

Figure 8:
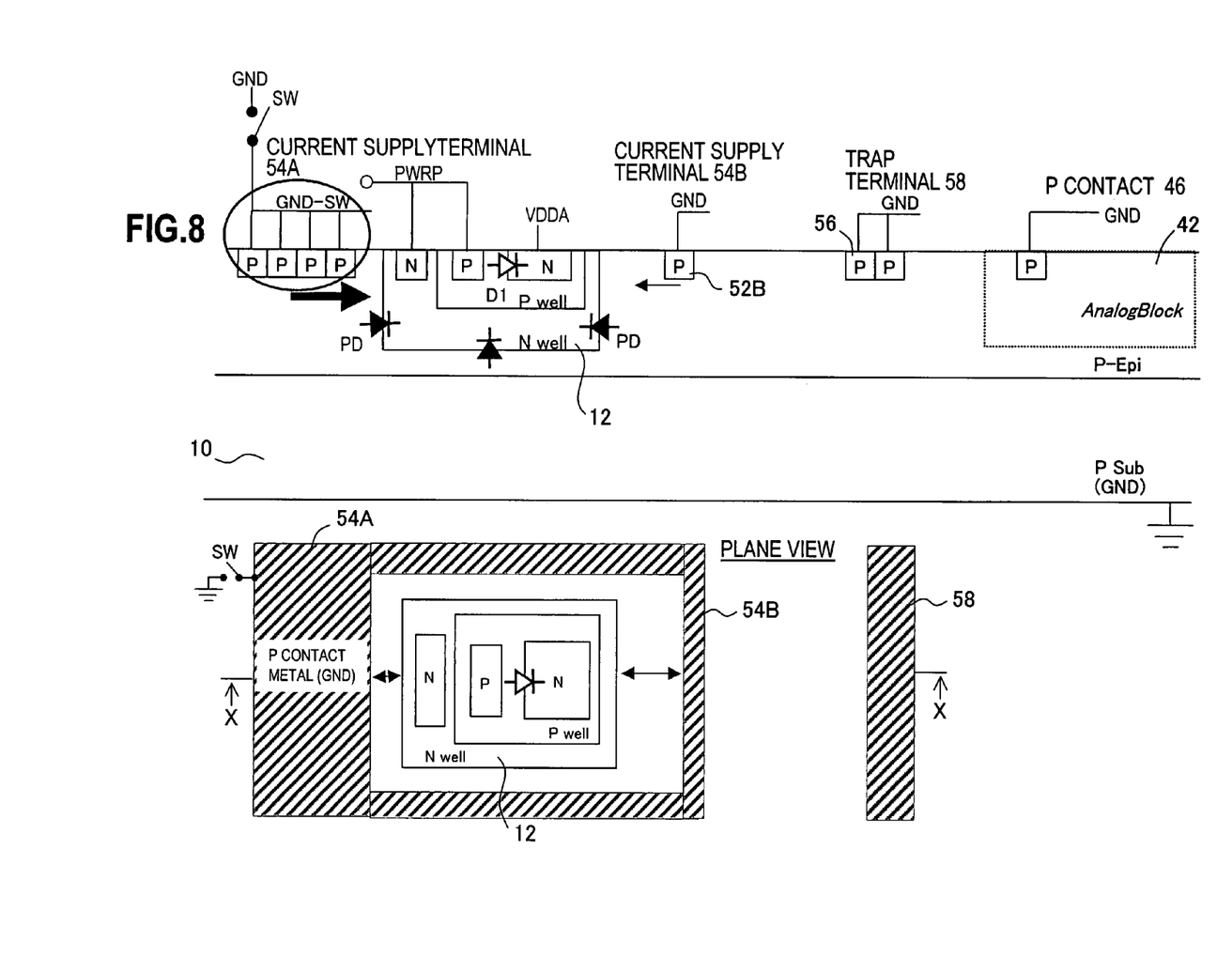
FIG. 8 is a cross-sectional view and plane view of a semiconductor device in a third embodiment.

FIG. 8 is a cross-sectional view and plane view of a semiconductor device in a third embodiment. The cross-sectional view and plane view are substantially the same as in FIG. 6. The only difference is the addition of a configuration in which the current supply terminals 54A, 54B are connected to ground power supply GND via a switch SW. This switch is an internal switch used to prevent improper analysis. When an attempt is made to acquire information in internal memory through some improper analysis of the semiconductor device, if this is detected through some sensing means such as a temperature sensor, frequency sensor, pressure sensor or similar, the internal switch SW is put into the open state, and the current supply terminals 54 are isolated from ground power supply GND. By this means, substrate current arising from the rectifier circuit operation does not flow from the current supply terminals 54, but flows into the integrated circuit region 42 to generate noise, causing malfunctions in the integrated circuit. In other words, the function to prevent integrated circuit malfunctions due to internal rectifier operation is suspended, thereby preventing improper analysis.

Figure 9:
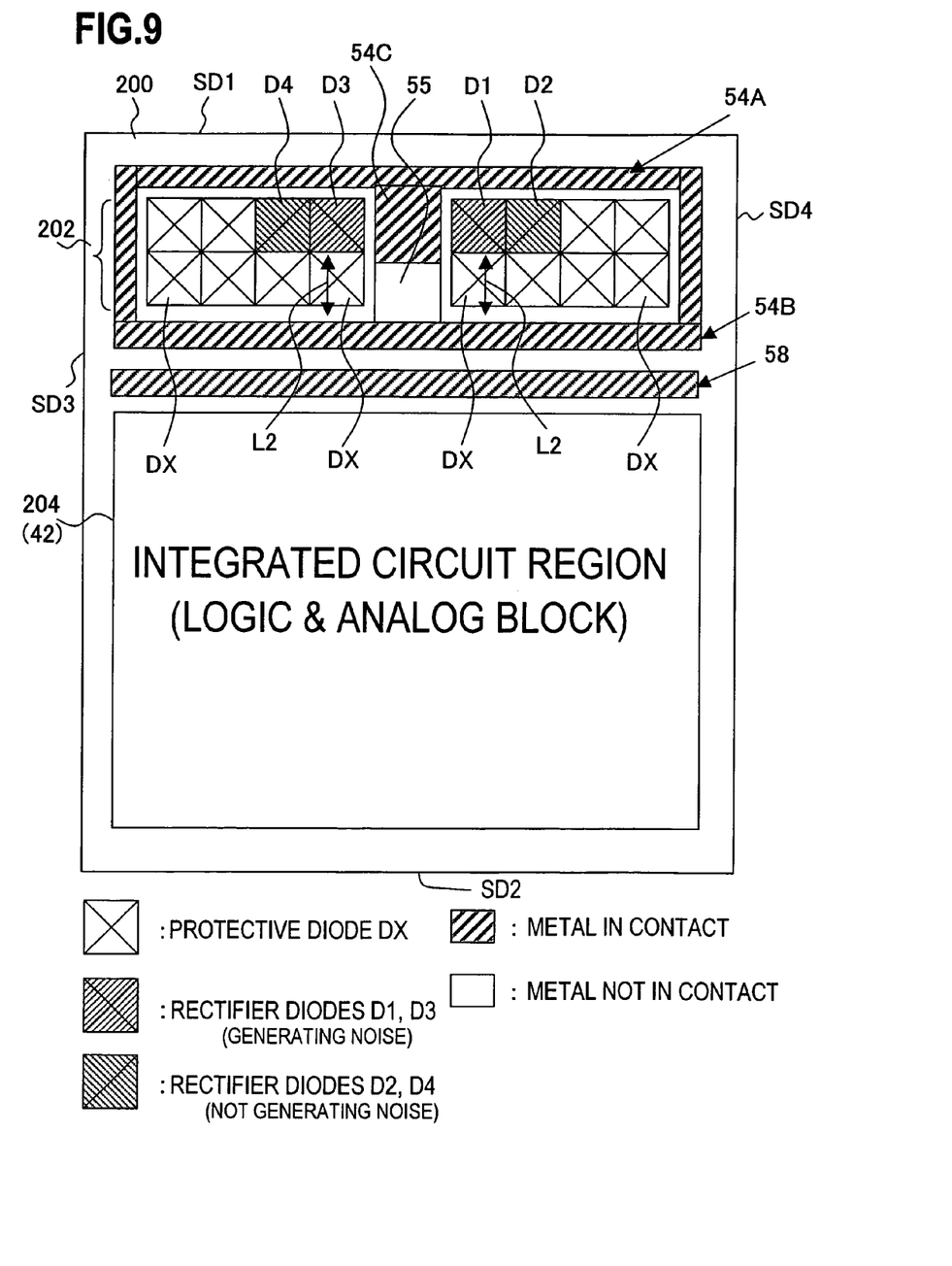
FIG. 9 is a plane view of a semiconductor device in a fourth embodiment.

FIG. 9 is a plane view of a semiconductor device in a fourth embodiment. In this example, the entire layout of a chip 200 comprising the substrate 10 is shown. The rectifier circuit region 202, in which are provided the diodes D1 to D4 and protective diodes DX of the rectifier circuit, is positioned adjacent to the upper edge SD1 of the chip 200; adjacent to the lower edge SD2 of the chip 200 is positioned the integrated circuit region 204, comprising logic circuits, analog circuits, memory circuits, and similar. This integrated circuit region 204 is the same as the integrated circuit regions 42 shown in FIG. 6 through FIG. 8.

In the rectifier circuit region 22, diodes D1 and D2 comprising the rectifier circuit bridge are positioned adjacently, and diodes D3 and D4 are also positioned adjacently. A protective diode DX is positioned on the periphery of the diodes D1 and D2, and a protective diode DX is also positioned on the periphery of the diodes D3 and D4. In particular, a protective diode DX is positioned between diode D1 and integrated circuit region 204, and similarly, a protective diode DX is positioned between diode D3 and integrated circuit region 204. The current supply terminals 54A, 54B are formed so as to surround the rectifier circuit region 202, and a trap terminal 58 is formed between the current supply terminal 54B and the integrated circuit region 202. The current supply terminal 54C is positioned in a region between and in proximity to diodes D1 and D3.

That is, the positional relationship in FIG. 9 between diodes D1 and D3 which are noise sources, the current supply terminals 54A, 54B and 54C, the trap terminal 58, and the integrated circuit region 204, is the same as in the first embodiment shown in FIG. 6. The first current supply terminal 54A and third current supply terminal 54C are positioned in proximity to the diodes D1 and D3, and the second current supply terminal 54B is positioned a distance L2 away from the diodes D1 and D3. However, the first current supply terminal 54A is positioned along the upper edge of the chip 200, on the side of the rectifier circuit region 202 opposite to the integrated circuit region 204. A protective diode DX is positioned in the space between the diodes D1 and D3 and the second current supply terminal 54B. In the region 55, although a metal layer is formed, there is no contact with the p-type substrate. Hence there is no supply of current to a parasitic diode from the metal layer of the region 55.

By means of this layout, substrate current flowing when the first parasitic diode is conducting is mainly supplied from the first current supply terminal 54A, positioned along the upper edge SD1 of the chip 200. Hence the effect of noise due to substrate currents on the integrated circuit region 204, positioned on the side of the lower edge SD2 opposing the upper edge SD1 of the chip 200, can be made extremely small. Also, by providing a region such as the region 55 which is not in contact with the substrate, substrate currents are made to flow in concentration in the first current supply terminal 54A along the upper edge SD1 of the chip. And by placing a protective diode DX in the space formed by providing the distance L2, the space effect can be enhanced. Substrate current which could not be collected by the first current supply terminal 54A can be collected by the second current supply terminal 54B and the trap terminal 58, so that the effect of substrate current noise on the integrated circuit region 204 can be further reduced.

As shown in FIG. 9, diodes D1 to D4 comprised by the rectifier circuit are placed in proximity to the upper edge SD1 of the chip, the first current supply terminal 54A is positioned between the diodes and the upper edge SD1 at a minimum distance from the diodes, and the substrate current flowing when the input power supply terminal is at negative potential is supplied mainly from the current supply terminal 54A on the side of the chip upper edge SD1. Consequently the occurrence of substrate currents flowing to the integrated circuit region 204, positioned on the opposite side of the rectifier circuit region 202 having the diodes, can be suppressed, and noise due to substrate currents as well as resulting malfunctions can be avoided.

Figure 10:
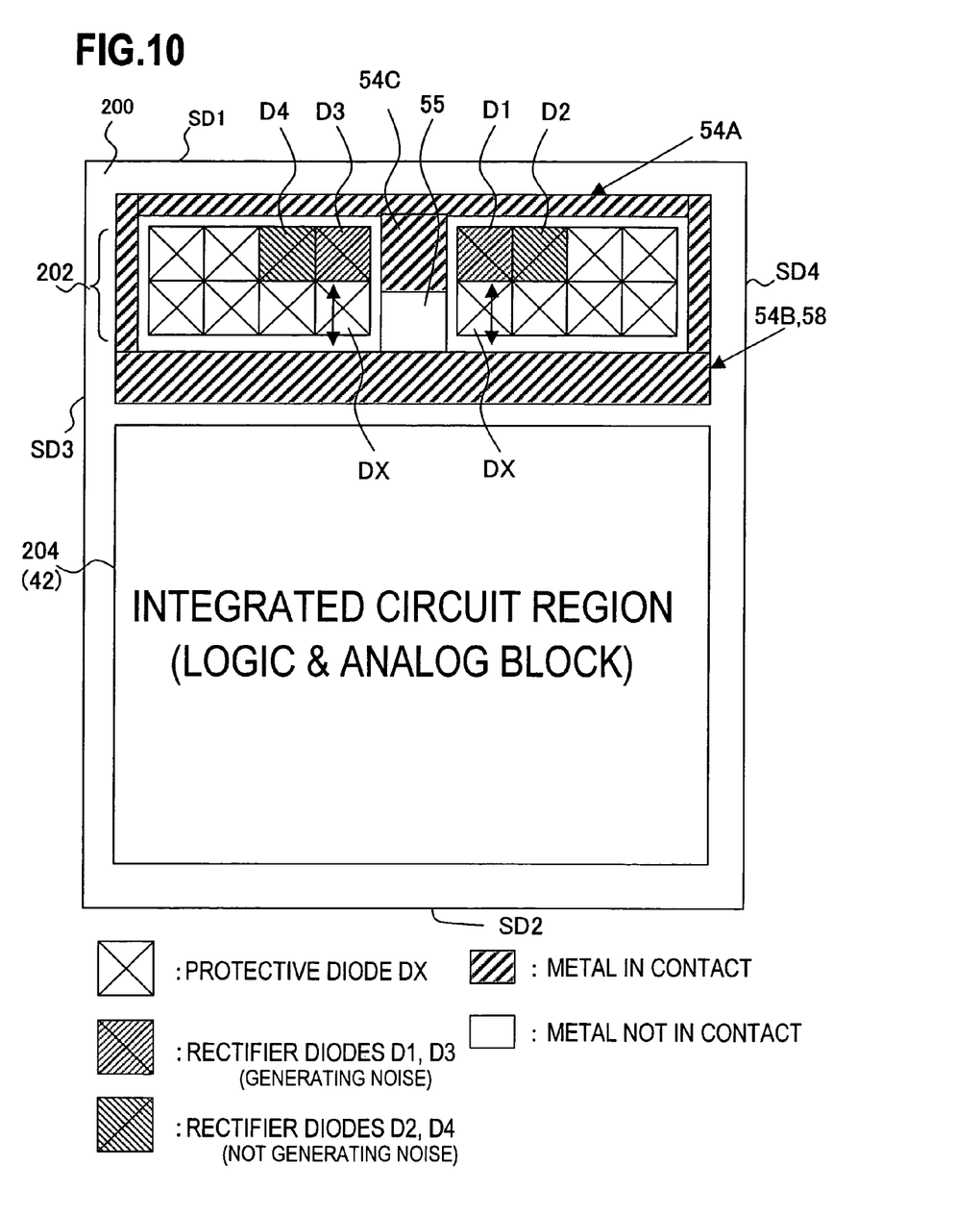
FIG. 10 is a plane view of a semiconductor device in a fifth embodiment.

FIG. 10 is a plane view of a semiconductor device in a fifth embodiment. In this layout, a difference with the fourth embodiment shown in FIG. 9 is the fact that the second current supply terminal 54B and the trap terminal 58 comprise a common metal layer. Otherwise the configuration is the same as in FIG. 9. Thus the second current supply terminal 54B and the trap terminal 58 can be configured in common as a large-area metal pattern. In this case also, substrate current is supplied mainly from the first current supply terminal 54A, positioned in closest proximity to the diodes D1 and D3.

Figure 11:
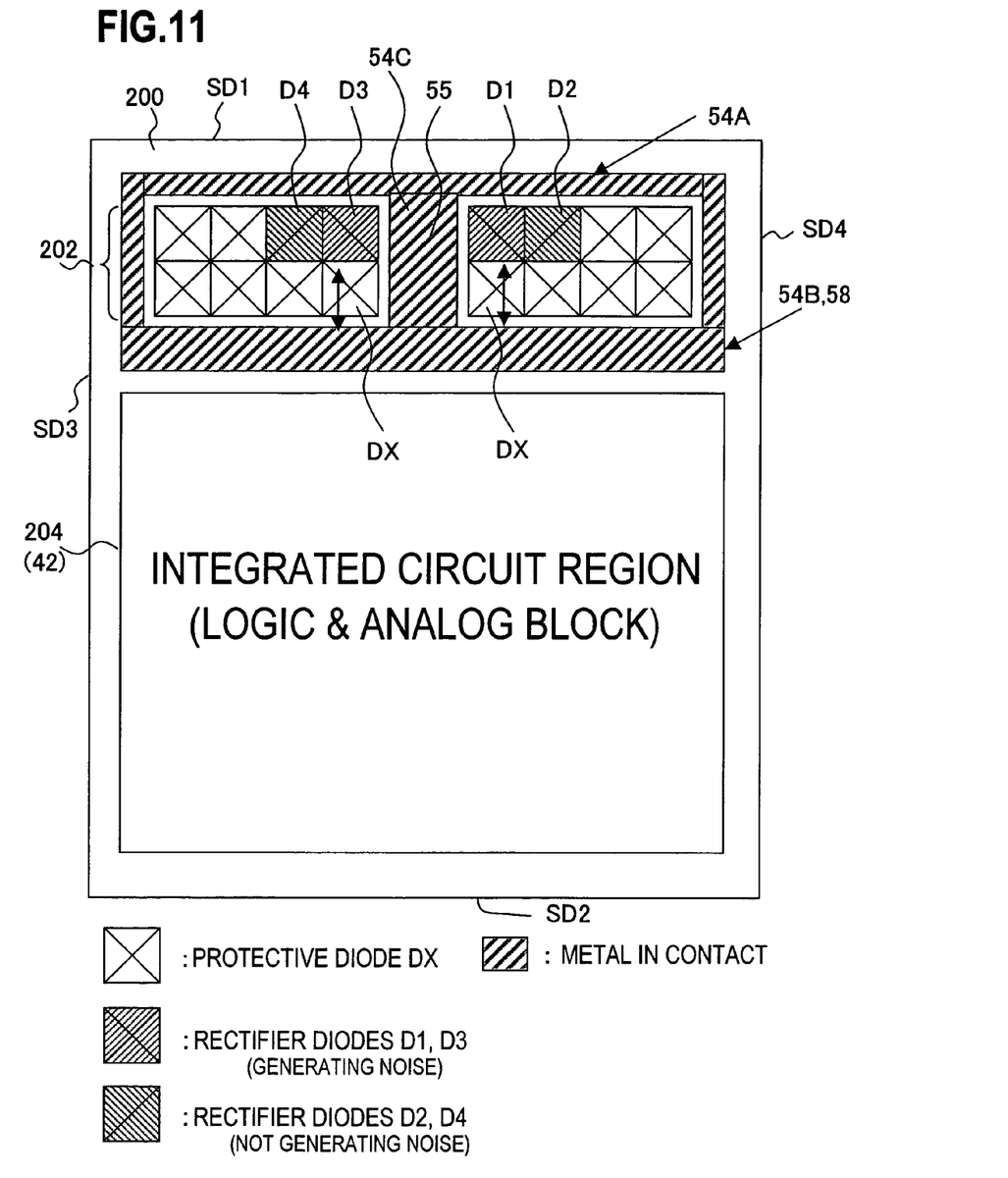
FIG. 11 is a plane view of a semiconductor device in a sixth embodiment.

FIG. 11 is a plane view of a semiconductor device in a sixth embodiment. In this layout, a difference with the fifth embodiment of FIG. 10 is the fact that the metal layer having contact with the substrate of the third current supply terminal 54C is also formed in the region 55. Otherwise the configuration is the same as in FIG. 10. By thus extending the third current supply terminal 54C, the current flowing from the n-type first well region of diodes D1 and D3 can be adequately supplied from the region in proximity to the chip upper edge SD1.

What is claimed is:

1. A semiconductor device, comprising:
   a rectifier circuit and an integrated circuit which are formed from a semiconductor substrate of a first conduction type and are provided on a top surface of the semiconductor substrate;
   a first well region of a second conduction type, formed within the semiconductor substrate of the first conduction type;
   a second well region of the first conduction type, formed within the first well region; and,
   a diode region of the second conduction type, formed within the second well region, which together with the second well region forms a diode, wherein
   the rectifier circuit comprises a plurality of the diodes;
   an input power supply terminal which changes between positive potential and negative potential is connected to the second well region and first well region of a first diode and to the diode region of a second diode and is provided on the top surface of the semiconductor substrate; and,
   a current supply terminal is provided on the top surface of the semiconductor substrate, connected to the semiconductor substrate and connected to a prescribed power supply, and which supplies current to a PN junction between the first well region and the semiconductor substrate when the potential of the input power supply terminal is negative.

2. The semiconductor device according to claim 1, wherein the current supply terminal includes:
   a first current supply terminal region, which is positioned at the periphery of the first well region of the first diode, and at a first distance from the first well region on a side opposite to a region where the integrated circuit is formed; and,
   a second current supply terminal region, positioned at a second distance longer than the first distance, from the first well region on the side of the region.

3. The semiconductor device according to claim 2, further comprising a trap terminal, between the first well region of the first diode and the integrated circuit, and between the current supply terminal provided on the side of the region and the region, the trap terminal being connected to the semiconductor substrate and to the prescribed power supply.

4. The semiconductor device according to claim 2, wherein a protective diode, connected to the input power supply terminal, is positioned between the first well region of the first diode and the second current supply terminal region.

5. The semiconductor device according to claim 1, wherein the current supply terminal is positioned so as to surround the first well region of the first diode.

6. The semiconductor device according to claim 5, wherein a trap terminal, connected to the semiconductor substrate and connected to the prescribed power supply, is provided so as to surround the periphery of the current supply terminal.

7. The semiconductor device according to claim 5, wherein a protective diode, connected to the input power supply terminal, is positioned between the first well region of the first diode and the current supply terminal region on the side of the integrated circuit region.

8. The semiconductor device according to claim 1, wherein the rectifying circuit includes a pair of the first diodes and a pair of the second diodes being bridge-connected, and a pair of the input power supply terminals are connected each at the point of connection of the first diodes and the second diodes.

9. The semiconductor device according to claim 1, wherein the current supply terminal is provided in proximity to the first well region of the first diode on a side opposite to a region where the integrated circuit is formed.

10. The semiconductor device according to claim 1, wherein a switch is provided between the current supply terminal and the prescribed power supply, and when a state different from normal operation is detected, the switch is put into an open state.

11. A semiconductor device, comprising:
a rectifier circuit and an integrated circuit which are formed from a semiconductor substrate of a first conduction type and are provided on a top surface of the semiconductor substrate;
a first well region of a second conduction type, formed within the semiconductor substrate of the first conduction type;
a second well region of the first conduction type, formed within the first well region; and,
a diode region of the second conduction type, formed within the second well region, which together with the second well region forms a diode, wherein
the rectifier circuit comprises a pair of first diodes and a pair of second diodes;
a pair of power supply terminals, which change between positive potential and negative potential, are connected to the second well region and the first well region of the first diodes and to the diode region of the second diodes respectively and are provided on the top surface of the semiconductor substrate; and,
a current supply terminal is provided in proximity to the first well region of the pair of first diodes and on the top surface of the semiconductor substrate, connected to the semiconductor substrate and connected to a prescribed power supply, and which supplies current to a PN junction between the first well region and the semiconductor substrate once the potential of the input power supply terminals is negative.

12. The semiconductor device according to claim 11, wherein the current supply terminals are provided in proximity to the first well regions of the first diodes, and on a side opposite to a region where the integrated circuit is formed.

13. The semiconductor device according to claim 11, wherein the current supply terminals are positioned on the periphery of the first well regions of the first diodes, at a first distance from the first well region on a side opposite to a region where the integrated circuit is formed, and are positioned at a second distance, longer than the first distance, from the first well region on the side of the region.

14. The semiconductor device according to claim 11, wherein the current supply terminals are positioned so as to surround the periphery of the first well region of the first diodes.

15. The semiconductor device according to claim 11, wherein first and second well regions in which are provided diodes constituting the rectifier circuit are positioned in proximity to a first edge of the chip, the integrated circuit is positioned on the side of a second edge opposite to the first edge of the chip, and the current supply terminals are respectively provided between the first edge and the diode positioned region of the rectifier circuit, and between the region in which is positioned the integrated circuit and the diode positioned region of the rectifier circuit.

16. A semiconductor device comprising:
a first circuit region where a rectifier circuit is formed from a semiconductor substrate of a first conduction type, wherein the first circuit region is provided on a top surface of the semiconductor substrate;
a second circuit region where an integrated circuit other than the rectifier circuit is formed from the semiconductor substrate of the first conduction type, wherein the second circuit region is provided on the top surface of the semiconductor substrate;
a first well region of a second conduction type, formed within the semiconductor substrate of the first conduction type;
a second well region of the first conduction type, formed within the first well region; and,
a diode region of the second conduction type, formed within the second well region, which together with the second well region forms a diode, wherein
the rectifier circuit comprises a plurality of the diodes; and
an input power supply terminal which changes between positive potential and negative potential is connected to the second well region and first well region of a first diode and to the diode region of a second diode and is provided on the top surface of the semiconductor substrate;
a current supply terminal is provided on the top surface of the semiconductor substrate, connected to the surface of the semiconductor substrate and connected to a prescribed power supply, and which supplies current to a PN junction between the first well region and the semiconductor substrate once the potential of the input power supply terminal is negative, and
said current supply terminal is closer to the first well region of the first diode than said second circuit region.

17. The semiconductor device according to claim 16, wherein the current supply terminal includes:
a first current supply terminal region, which is positioned at the periphery of the first well region of the first diode, and at a first distance from the first well region on a side opposite in a planar direction of the semiconductor substrate to the second circuit region; and,
a second current supply terminal region, positioned between the first well region of the first diode and the second circuit region and at a second distance longer than the first distance from the first well region.

18. The semiconductor device according to claim 16, wherein the current supply terminal is provided in proximity to the first well region of the first diode on a side opposite in a planar direction of the semiconductor substrate to a second circuit region.

* * * * *